(12) United States Patent
DeSilva

(10) Patent No.: US 6,215,188 B1
(45) Date of Patent: Apr. 10, 2001

(54) LOW TEMPERATURE ALUMINUM REFLOW FOR MULTILEVEL METALLIZATION

(75) Inventor: Melvin Joseph DeSilva, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 08/984,596

(22) Filed: Dec. 3, 1997

Related U.S. Application Data

(62) Division of application No. 08/741,255, filed on Oct. 30, 1996.

(51) Int. Cl.$^7$ ............................ H01L 23/48; H01L 23/52; H01L 29/40
(52) U.S. Cl. ........................ 257/773; 257/774; 257/767; 257/751
(58) Field of Search ................... 257/773, 774, 257/767, 751; 438/660

(56) References Cited

U.S. PATENT DOCUMENTS

| | | | |
|---|---|---|---|
| 4,997,518 | 3/1991 | Madakoro | 156/643 |
| 5,066,611 | 11/1991 | Yu | 437/173 |
| 5,124,780 | 6/1992 | Sandhu et al. | 357/67 |
| 5,266,521 | 11/1993 | Lee et al. | 437/188 |
| 5,418,187 | 5/1995 | Miyanaga et al. | 437/194 |
| 5,427,982 | 6/1995 | Jun | 437/195 |
| 5,523,259 | 6/1996 | Merchant et al. | 437/190 |
| 5,534,463 | 7/1996 | Lee et al. | 437/195 |
| 5,552,341 | 9/1996 | Lee | 437/192 |
| 5,604,155 | 2/1997 | Wang | 437/190 |
| 5,610,105 | 3/1997 | Vines et al. | 437/235 |
| 5,665,641 | 9/1997 | Shen et al. | 438/643 |
| 5,668,055 | 9/1997 | Xu et al. | 438/637 |
| 5,864,179 | * 1/1999 | Koyama | 257/767 |
| 5,869,902 | * 2/1999 | Lee et al. | 257/773 |

FOREIGN PATENT DOCUMENTS

| | | | |
|---|---|---|---|
| 44 08 564 A1 | 7/1995 | (DE) | H01L/21/768 |
| 0 655 780 A1 | 5/1995 | (EP) | H01L/21/768 |
| 0 741 407 A2 | 11/1996 | (EP) | H01L/21/768 |
| 62-205792 | 6/1989 | (JP) | H01L/21/90 |

OTHER PUBLICATIONS

Z. Shterenfeld–Lavie et al, "A 3–Level, 0.35αm Interconnection Process Using an Innovative, High Pressure Aluminum Plug Technology," Proceedings of the VMIC Conf., pp. 31–37 (Jun. 27–29, 1995).

* cited by examiner

Primary Examiner—Tom Thomas
Assistant Examiner—Thien F. Tran
(74) Attorney, Agent, or Firm—Theodore E. Glanthay; Lisa K. Jorgenson; Dan Venglarik

(57) ABSTRACT

The present invention provides a method for minimizing voids in a plug. The process begins by forming a conformal barrier layer within the hole and then forming a metal plug within the hole. Thereafter, a cap layer is formed over the metal plug in which the cap layer has a lower thermal expansion coefficient than the metal plug. The hole is heated such that the metal in the hole flows to eliminate the void as a result of the compressive stress generated by the cap layer on the metal plug.

20 Claims, 3 Drawing Sheets

LOW TEMPERATURE ALUMINUM REFLOW FOR MULTILEVEL METALLIZATION

This is a Division of application Ser. No. 08/741,255, filed Oct. 30, 1996, pending.

BACKGROUND OF THE INVENTION

1. Technical Field

The present invention relates generally to manufacturing semiconductor devices and in particular to creating contacts and via plugs in semiconductor devices. Still more particularly, the present invention relates to an improved method for creating contacts and via plugs in semiconductor devices in which voids are minimized.

2. Description of the Related Art

Current interconnect technology employs contact and via plugs to transmit interlayer signals and interconnect lines to transmit signals along the same layer. The contact or via plugs are filled either by tungsten chemical vapor deposition (CVD) or hot aluminum physical vapor deposition (PVD). The interconnecting lines are created using PVD aluminum. Currently available hot aluminum processes for contact and via plugs involve sputter depositing by PVD a thin titanium layer (100 nm) on the substrate after the via hole is etched in the interlayer dielectric. This titanium layer provides good contact for an underlying conductor and also provides a good wetting layer for a subsequent hot aluminum process. Thereafter, the wafer is moved under vacuum to an aluminum deposition chamber in which three steps occur. First, a 200–250 nm thick nucleating layer of aluminum is deposited at a high rate of about 15 nm/s to about 20 nm/s at a low temperature to fully cover the titanium on the sidewalls and the bottom of the via. Next, the temperature of the substrate is increased to 400° C. to 550° C. More aluminum (about 400 nm) is deposited at a slower rate of about 3 nm/s. This slow deposition rate at a high temperature allows the aluminum to flow into the via as the aluminum is being deposited. This process makes use of surface diffusion to allow the aluminum to flow into the vias. Surface diffusion refers to the movement of aluminum atoms on the surface at high temperatures. Then, once the via is completely filled with aluminum, the remaining aluminum required, is again deposited at a fast rate of 15 nm/s. The wafer is then moved to a titanium nitride (TiN) deposition chamber in which a 30 nm thick TiN film is deposited. This film acts as an antireflective coating (ARC) for subsequent photolithographic processing.

Another process currently used to fill vias using aluminum involves a force fill process as disclosed in Shterenfeld-Lavie, et al., *A Three-Level, 0.35 μm Interconnection Process Using an Innovative High Pressure Aluminum Plug Technology*, VMIC Conference, ISMIC-104/95/031, Pages 31–37. This method eliminates or minimizes voids within the contact or via plugs by using conventional sputtering to deposit metal films at relatively low temperatures (430° C.) and then using high pressure argon to promote metal flow into high aspect contacts on vias. This force fill method, however, requires expensive equipment to form contact and via plugs.

Therefore, it would be advantageous to have an improved method for forming via and contact plugs while minimizing voids.

SUMMARY OF THE INVENTION

The present invention provides a method for minimizing voids in a plug. The process begins by forming a conformal barrier layer within the via or contact hole and then forming a metal plug within the hole. Thereafter, a cap layer is formed over the metal plug in which the cap layer has a lower thermal expansion coefficient than the metal plug. The substrate is heated such that the metal in the via or contact hole flows to eliminate the void as a result of the compressive stress generated by the cap layer on the metal plug.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
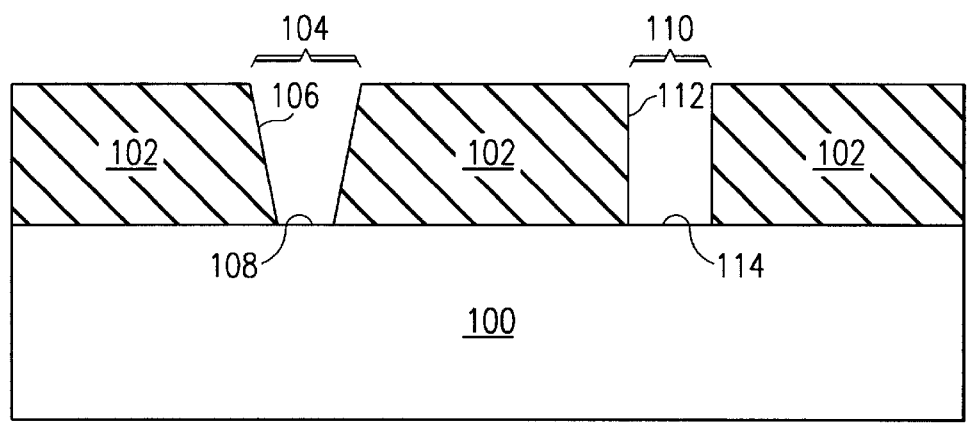
FIGS. 1–5 are cross-sectional views of a portion of a semiconductor device illustrating the process of minimizing voids according to the present invention.

FIGS. 1–5 are cross-sectional views of a portion of a semiconductor device illustrating the process of minimizing voids according to the present invention. With reference now to FIG. 1, a cross-section of a portion of a semiconductor device including two holes in an insulating layer is depicted according to the present invention. In FIG. 1, substrate 100 has an insulating layer 102 formed on the surface of substrate 100. Although the depicted example shows a substrate, substrate 100 could be metal or some other interlevel layer according to the present invention. Insulating layer 102 is an oxide layer in the depicted example although other types of insulating layers may be employed according to the present invention.

Figure 2:
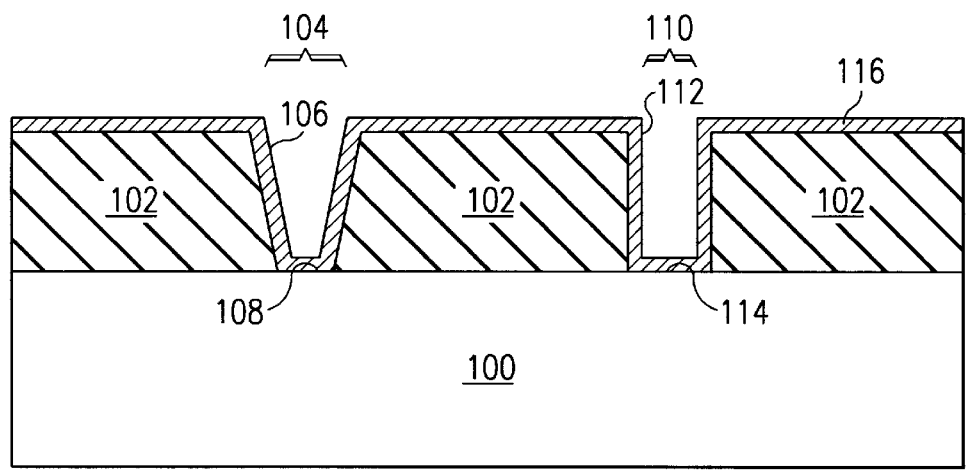
Figure 3:
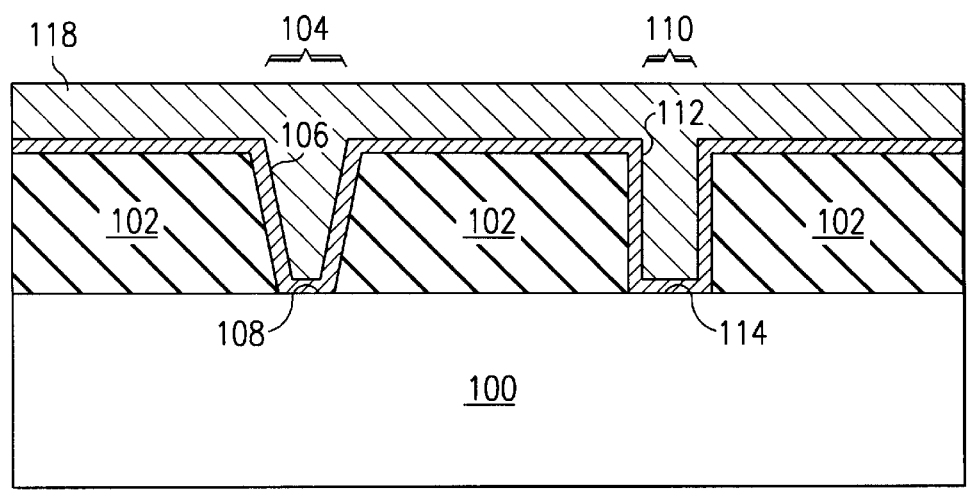
Figure 4:
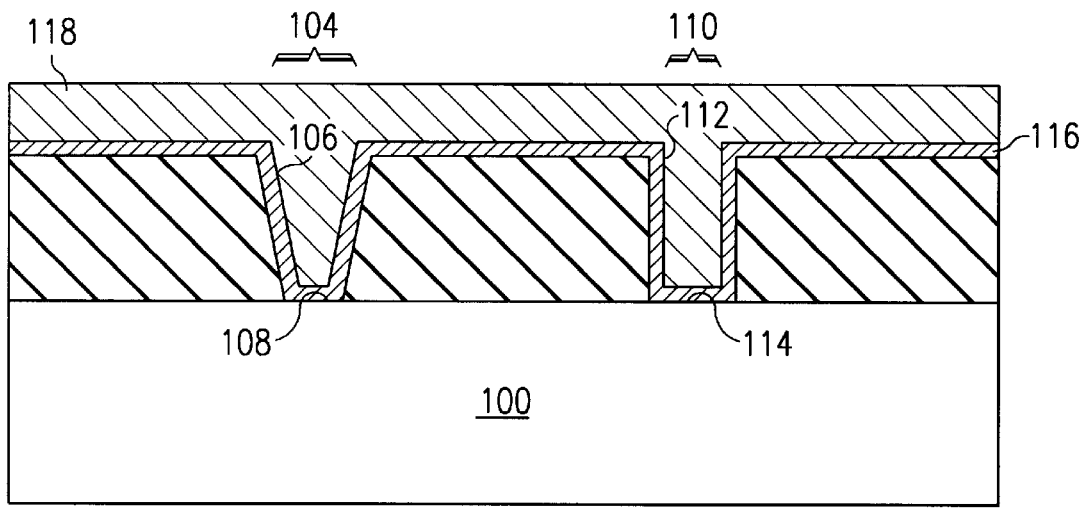

Insulating layer 102 includes a hole 104 with sloped sidewalls 106 and a bottom 108. Insulating layer 102 also includes a hole 110 with vertical sidewalls 112 and a bottom 114. A barrier layer 116 is formed on the semiconductor device as shown in FIG. 2. In the depicted example, barrier layer 116 is a thin titanium layer having a thickness of about 100 nm that is sputter deposited using physical vapor deposition. Barrier layer 116 is a conformal layer covering the sidewalls and bottoms of the holes. The titanium is deposited at a low temperature, typically 100°C. or less. Thereafter, the device is placed under vacuum in an aluminum chamber and aluminum is deposited at a low temperature of 100°C. or less. This deposition results in the formation of aluminum layer 118 which includes a void 120 in hole 104 and a void 122 in hole 110. Aluminum layer 118 is from about 300 nm to 850 nm in the depicted example and deposited at a rate from about 3 nm/s to about 20 nm/s. Thereafter, an antireflective coating or "cap layer" 124 is deposited over aluminum layer 118. The term "hole" is used to refer to either a via hole or a contact hole according to the present invention. In the depicted example, the antireflective coating is titanium nitride (TiN). A TiN film of about 30 nm to about 120 nm is deposited on top of aluminum layer 118 at a low temperature of 100°C. or less under a vacuum.

Figure 5:
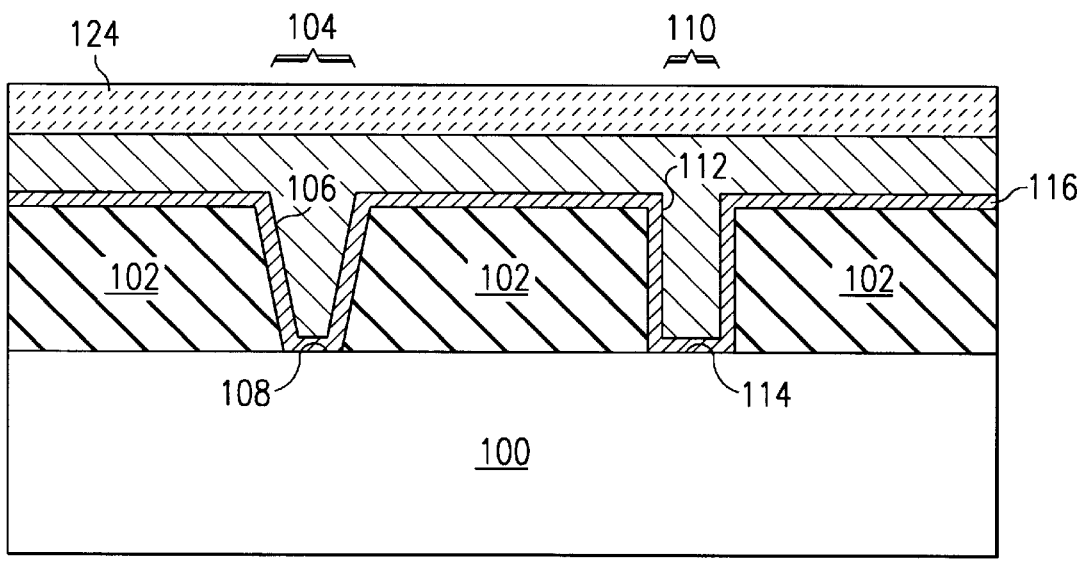

Thereafter, the semiconductor device is annealed either in the PVD system itself or in a rapid thermal annealing (RTA) machine or in a batch type furnace, such as from about 15 minutes to about 30 minutes. The temperature for the anneal is from about 350°C. to 550°C. in the depicted example and may vary depending on the hole size and aspect ratio. The annealing time in the PVD or RTA machine is from about 2 to 3 minutes. Longer annealing times may be used in a batch type furnace, such as from about 15 minutes to about 30 minutes. During the annealing of the semiconductor device, aluminum moves into the hole and provides further contact with the underlying metal or conductor layer, minimizing or eliminating voids 120 and 122. As can be seen in FIG. 5, voids 120 and 122 have been eliminated.

The cap layer 124 can be a titanium nitride layer deposited by sputtering. Other types of caps are possible, such as for example, PECVD $SiO_2$ (silicon dioxide) or $Si_3N_4$. Tantalum also may be used in the cap layer. In the depicted example, the cap layer also can form the antireflective coating.

As the semiconductor heats up, increased compressive/thermal stress occurs on aluminum film 118 because of a difference in the thermal expansion coefficient between aluminum and barrier layer 116 and cap layer 124. The compressive stress forces aluminum to flow fully into holes 104 and 110 eliminating holes 120 and 122. Absent cap layer 124, hillocks would form on the top surface of aluminum layer 118 and aluminum would not flow into holes 104 and 110 to eliminate voids 120 and 122. Holes 104 and 110 have a diameter of about 0.35 μm to 0.85 μm at the top. Although the depicted example employs aluminum, other metals may be employed so long as the compressive stress on the metal or other material is greater than that of the material forming the barrier layer. Additionally, it is contemplated that other barrier layers may be employed so long as the compressive stress on that barrier layer is less than that of the material filling the hole.

Alternatively, aluminum layer 118 could be deposited at temperatures higher than 100°C. and then lowering the temperature of the device to the temperature used to deposit cap layer 124. In cooling aluminum layer 118, some negative (tensile) stress occurs in 118. As a result, when the device is heated or annealed, the amount of compressive stress on aluminum layer 118 due to barrier layer 116 is reduced. However, the compressive stress on aluminum layer 118 due to the cap layer 124 will still be present. For example, barrier layer 116 would be formed at a temperature of about 100°C. Then, aluminum layer 118 is deposited at a temperature of about 300°C. to about 400°C. The semiconductor device is cooled to about 100°C. for formation of cap layer 124 using TiN. Thereafter, the device is heated to about 400°C. to about 550°C., still resulting in thermal compressive stress within aluminum layer 118 due to cap layer 124 that eliminates voids 120 and 122 in holes 104 and 110. However, the amount of compressive stress on aluminum layer 118 due to barrier layer 116 is reduced. By annealing the device at a temperature higher than the temperature used to form cap layer 124, compressive thermal stress is still present for eliminating the voids.

Figure 6A:
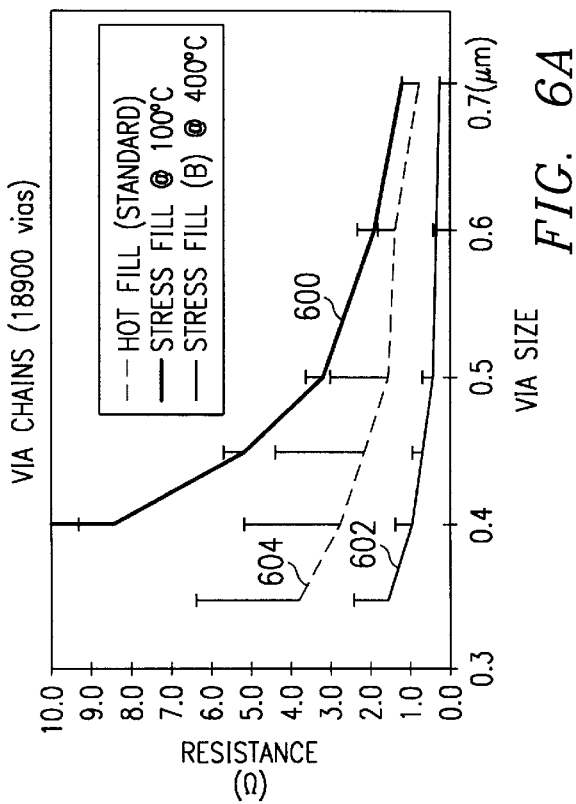
FIGS. 6A–6B are graphs of resistance in via chains comparing the process of the present invention to a known process.
Figure 6B:
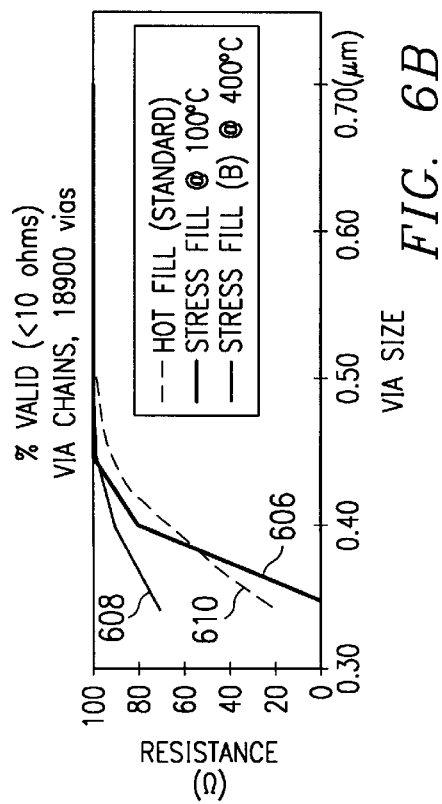

Turning next to FIGS. 6A and 6B, are graphs showing the resistance in via chains are depicted in which via chains manufactured according to the present invention are compared to via chains using a known process. In FIG. 6A, the x-axis represents the size of the via (diameter) in micrometers while the y-axis represents the resistance in ohms (Ω). Each via chain includes 18,900 vias created closely together with a connect of metal on the top and the bottom of the via. The resistance shown for each point is the resistance of the entire structure, a single via chain. Line 600 illustrates resistance for via chains created in accordance with a preferred embodiment of the present invention in which aluminum is deposited at 100°C. Line 602 shows data from via chains in which aluminum is deposited at 400°C. In both line 600 and line 602, the structure is annealed at 450°C. In particular, both lines 600 and 602 represent data from via chains manufactured using a titanium barrier layer, and aluminum plug or interconnect, and a titanium nitride cap.

Line 604 contains data from a known hot fill process in which a thin titanium layer of about 100 nm is sputtered on the substrate and in which deposition first occurs by depositing a thick nucleating layer of aluminum that is from about 200 to about 250 nm thick at a high rate of about 15 to about 20 nm/s at a low temperature to fully cover the titanium on the sidewalls and the bottom of the via. Thereafter, in this traditional hot fill method, the temperature of the substrate is increased to about 450 to about 550°C. Additional aluminum (about 400 nm) is then deposited at a slower rate of about 3 nm/s. After the via is completely filled with aluminum, the remaining aluminum is then deposited at a fast rate of 15 nm/c. Thereafter, a 30 nm thick titanium nitride film is deposited to form a antireflective coating.

FIG. 6B illustrates the percent valid from via chains as shown in FIG. 6A. The x-axis shows the via size (diameter) while the y-axis shows resistance. In particular, any via chains having a resistance of greater than 10 ohms is considered invalid and not used in the graph. This graph indicates defects in voids. This graph is generated from the same data used in FIG. 6A. Line 606 is generated from the same data as line 600; line 608 is generated from data shown in line 602; and line 610 corresponds to the data from the known hotfill method in line 604.

Figure 7A:
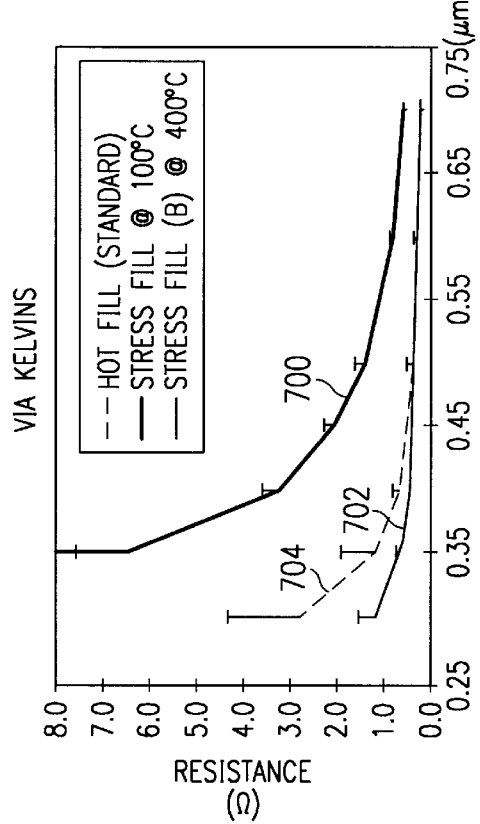
FIGS. 7A–7B are graphs of resistance in a via comparing the process according to the present invention to a known process.
Figure 7B:
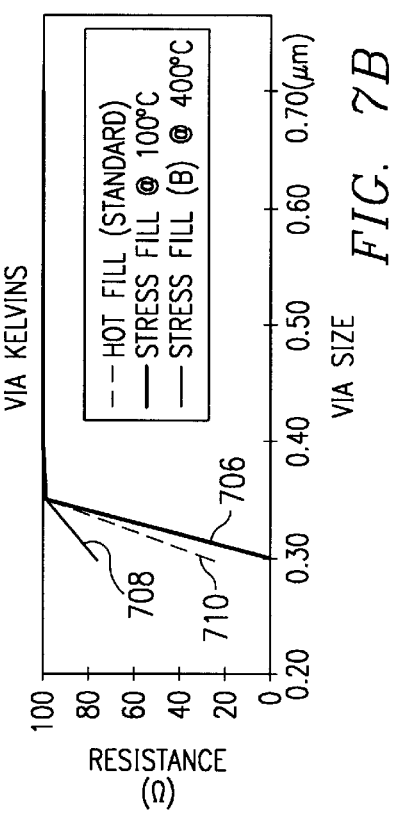

FIGS. 7A and 7B illustrate data from test of individual vias using the processes of the present invention compared to a known process. In particular, FIG. 7A shows resistance on the y-axis in ohms and via size on the x-axis in micrometers. Line 700 shows results from vias in which aluminum is deposited at 100°C. and line 702 shows results from vias in which aluminum is deposited at 400°C. Both line 700 and 702 illustrate results from vias generated in accordance with a preferred embodiment of the present invention. Line 704 shows results from a known hotfill method. FIG. 7B illustrates data similar to that shown in FIG. 6B as described above. Line 706 illustrate data for vias generated in accordance with a preferred embodiment of the present invention in which aluminum is deposited at 100°C., while line 708 shows results from vias manufactured in accordance with a preferred embodiment of the present invention in which aluminum is deposited at 400°C. Line 710 shows results from a traditional hotfill method.

Thus, the present invention provides a low temperature aluminum deposition process in which the surface of the aluminum is very smooth before annealing. During annealing, the TiN cap layer prevents aluminum surface diffusion and the surface remains smooth even after annealing at high temperatures.

The TiN cap layer serves both as an antireflective coating as well as applying compressive stress on aluminum layer 118. During annealing treatments, the thermal compressive stress helps aluminum to flow into the voids. The compressive stress from changing the temperature from about 100°C. to 550°C. is about 9E9 dynes/cm$^2$. Aluminum has a linear thermal expansion of 24e10$^{-6}$ per degree C at 25°C. TiN has a linear thermal expansion coefficient of 9.35e10$^{-6}$ per degree C at 25°C., silicon has a linear thermal expansion coefficient of about 3e10$^{-6}$ per degree C at 25°C. More information on linear thermal expansion coefficients may be found in Muraka, *Metallization: Theory and Practice for VSLI and ULSI*, Butterworth-Heinemann, Stoneham, Mass. (1993). Although surface diffusion on the top surface is not a critical mechanism for filling voids, surface diffusion requires PVD systems with high vacuums. As a result, the present invention provides an advantage of not requiring high vacuum PVD systems. Additionally, the present invention provides an advantage in that costly pressure chambers are not required such as those employed in high pressure aluminum plug processes.

An additional advantage of the present invention is that current hot fill technology employs dynamic surface diffusion during deposition and does not work reliably for small via sizes, such as holes having a upper diameter of about less than 0.50 μm. The present invention does not require dynamic surface diffusion to eliminate voids and can be employed with subhalf micron technologies. Additionally, current aluminum hot fill processes require tapers, such as slanted sidewalls 106 in hole 104. The present invention may be employed effectively for a hole with vertical sidewalls, such as hole 110.

The present invention does not rely on surface diffusion, which is more relevant to high temperature deposition of aluminum. Grain boundary diffusion is increased based on the low temperature deposition of the aluminum layer. Low temperatures result in smaller grains, which provide for high grain boundary areas and high grain boundary diffusion. Dislocation diffusion is increased under the process of the present invention because of the higher stress that causes more dislocations.

While the invention has been particularly shown and described with reference to a preferred embodiment, it will be understood by those skilled in the art that various changes in form and detail may be made therein without departing from the spirit and scope of the invention.

What is claimed is:

1. A contact in a semiconductor device comprising:
    a hole having a bottom and sidewalls and a width in an upper portion of less than about 0.50 μm;
    a barrier layer having a first linear thermal expansion coefficient and covering the bottom and sidewalls;
    a metal contact having a second linear thermal expansion coefficient, and an internal tensile stress; and
    a cap layer formed on the metal contact greater than the first and second linear thermal expansion coefficients, the cap layer exerting a compressive stress on the metal contact.

2. The contact of claim 1, wherein the metal contact is an aluminum contact.

3. The contact of claim 1, wherein the barrier layer is a titanium layer.

4. The contact of claim 3, wherein the titanium layer has a thickness of about 100 nm.

5. The contact of claim 1, wherein the cap layer is a titanium nitride layer.

6. The contact of claim 5, wherein the titanium nitride layer has a thickness of about 30 nm to about 120 nm.

7. The contact of claim 1, wherein the hole has vertical sidewalls.

8. The contact of claim 1, wherein the hole has slanted sidewalls.

9. An intermediate structure for forming a contact in an integrated circuit, comprising:
    an insulating layer including a hole having a bottom and sidewalls and an upper width of less than about 0.50 μm;
    a barrier layer formed on the bottom and sidewalls of the hole and having a first linear thermal expansion coefficient;
    an aluminum layer formed in the hole over the barrier layer and over adjacent portions of the insulating layer, a portion of the aluminum layer forming a plug within the hole, the aluminum layer having a second thermal expansion coefficient and an internal tensile stress; and
    a capping layer formed on the aluminum layer temperature less than the second temperature,
    the capping layer having a third linear thermal expansion coefficient greater than the first and second linear thermal expansion coefficients and exerting a compressive stress on the aluminum layer.

10. The intermediate structure of claim 9, wherein the compressive stress on the aluminum layer reflows a portion of the aluminum layer into the hole.

11. The intermediate structure of claim 9, wherein the barrier layer produces a compressive stress on the aluminum layer which is less than the compressive stress exerted on the aluminum layer by the capping layer.

12. The intermediate structure of claim 9, wherein the barrier layer is a titanium layer having a thickness of about 100 nm formed at a temperature of about 100°C. or less.

13. The intermediate structure of claim 9, wherein the aluminum layer is formed at a temperature of about 300°C. to about 400°C.

14. The intermediate structure of claim 9, wherein the capping layer is a titanium nitride layer having a thickness of about 30 nm to about 120 nm formed at a temperature of about 100°C.

15. The intermediate structure of claim 9, wherein the temperature of the barrier layer, the aluminum layer, and the capping layer is about 400°C. to about 550°C.

16. A structure of a contact in an integrated circuit, comprising:
    an insulating layer including a hole having a bottom and sidewalls, the hole having a width of less than about 0.50 μm;
    a barrier layer having a first linear thermal expansion coefficient formed on the bottom and sidewalls of the hole;
    an aluminum layer having a second linear thermal expansion coefficient formed in the hole over the barrier layer and over adjacent portions of the insulating layer, a portion of the aluminum layer forming a plug within the hole, the aluminum layer having an internal tensile stress; and
    a capping layer having a third linear thermal expansion coefficient greater than the first and second linear thermal expansion coefficients formed on the aluminum layer;
    and exerting a compressive stress on the aluminum layer.

17. The structure of claim 16, wherein the barrier layer produces a tensile stress on the aluminum layer.

18. The structure of claim 16, wherein the temperature of the barrier layer, the aluminum layer, and the capping layer is less than about 100° C.

19. The structure of claim 16, wherein the barrier layer is a titanium layer having a thickness of about 100 nm.

20. The structure of claim 16, wherein the capping layer is a titanium nitride layer having a thickness of about 30 nm to about 120 nm.

* * * * *